(12) United States Patent
Alzaher

(10) Patent No.: US 8,482,343 B1
(45) Date of Patent: Jul. 9, 2013

(54) DIGITALLY PROGRAMMABLE HIGH-ORDER FILTER

(75) Inventor: Hussain Alzaher, Dhahran (SA)

(73) Assignees: King Fahd University of Petroleum and Minerals, Dhahran (SA); King Abdulaziz City of Science and Technology, Riyadh (SA)

( * ) Notice: Subject to any disclaimer, the term of this patent is extended or adjusted under 35 U.S.C. 154(b) by 0 days.

(21) Appl. No.: 13/437,797

(22) Filed: Apr. 2, 2012

(51) Int. Cl.
*H03B 1/00* (2006.01)

(52) U.S. Cl.
USPC ............................................. 327/553

(58) Field of Classification Search
USPC ................................................. 327/551–559
See application file for complete search history.

(56) References Cited

U.S. PATENT DOCUMENTS

| | | | |
|---|---|---|---|
| 5,798,670 A * | 8/1998 | Lee | 327/552 |
| 6,405,230 B1 | 6/2002 | Richards et al. | |
| 7,239,196 B2 | 7/2007 | Hasegawa | |
| 7,496,865 B2 | 2/2009 | Chang et al. | |
| 7,535,289 B2 * | 5/2009 | Kasperkovitz | 327/558 |
| 7,760,014 B2 | 7/2010 | Ohannaidh | |
| 2010/0005430 A1 | 1/2010 | Chang et al. | |

OTHER PUBLICATIONS

Digitally programmable high-order current-mode universal filters, Alzaher, H.A. et al., May 2011, Analog Integrated Circuits and Signal Processing, vol. 67 No. 2, pp. 179-187.

* cited by examiner

*Primary Examiner* — Lincoln Donovan
*Assistant Examiner* — Sibin Chen
(74) *Attorney, Agent, or Firm* — Richard C. Litman

(57) ABSTRACT

The digitally programmable high-order filter uses simple active elements, namely DCCAs and VBs, with the help of R-2R ladders to realize several $n^{th}$-order filters, 'n+3' DCCAs and 'n' VBs may be used, and can provide programmability to either the filter's numerator coefficients or to the denominator coefficients. The digitally programmable high-order filter may include R-2R ladders in its negative feedback loops, resulting in a filter in which all coefficients are programmable.

16 Claims, 9 Drawing Sheets

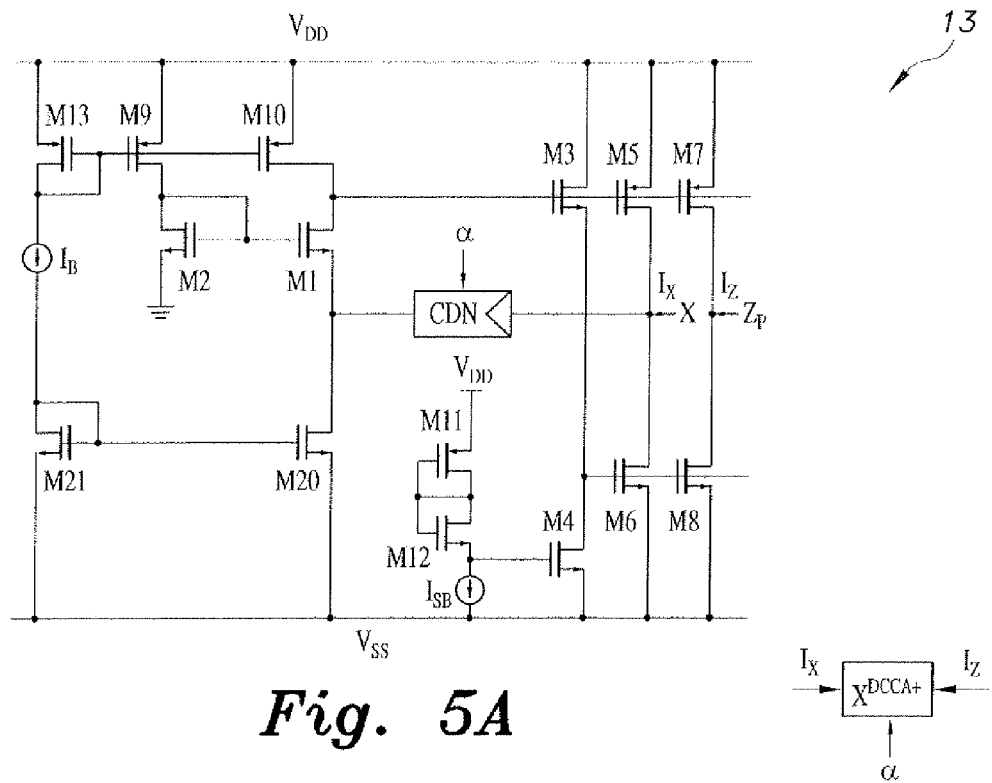
Fig. 5A
Fig. 5B
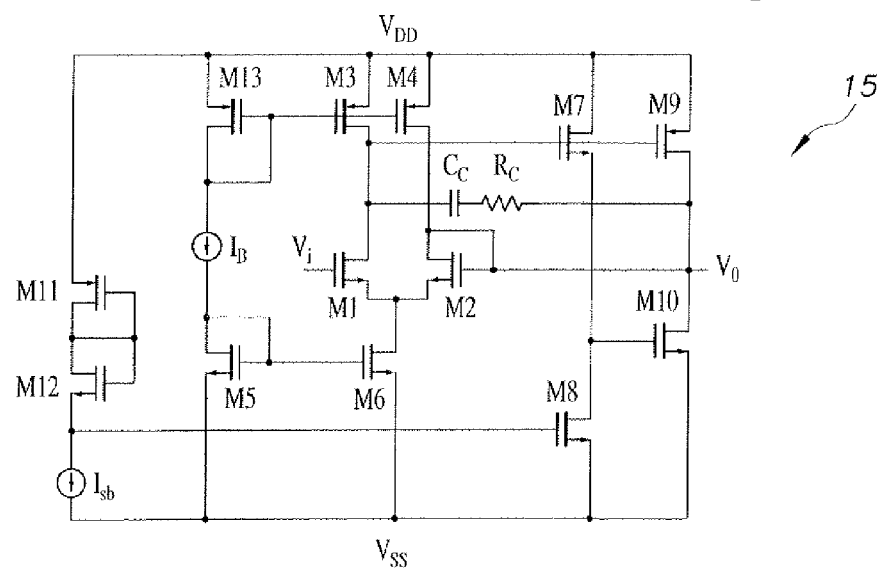
Fig. 6

DIGITALLY PROGRAMMABLE HIGH-ORDER FILTER

BACKGROUND OF THE INVENTION

1. Field of the Invention

The present invention relates to analog filters, and particularly to a digitally programmable high-order filter analog filter.

2. Description of the Related Art

Current-mode building blocks (CMBBs), transconductance amplifiers (gm), and operation transconductance amplifiers (OTAs) have been used to realize several high-order filters. Prior art filters however, have a single output and modifying the filter type would require changes in the hardware. In addition, the absence of a programmability feature hinders the use of most of these filters in integrated circuit (IC) applications.

Thus, a digitally programmable high-order filter solving the aforementioned problems is desired.

SUMMARY OF THE INVENTION

The digitally programmable high-order filter uses simple active elements, namely, DCCAs (digitally controlled current amplifiers) and VBs (unity gain voltage buffers) with the help of R-2R ladders, in order to realize several $n^{th}$-order filters. Both DCCAs and n VBs may be used, and can provide programmability to either the filter's numerator coefficients or to the denominator coefficients. The digitally programmable high-order filter may include R-2R ladders in its negative feedback loops, resulting in a filter in which all coefficients are programmable.

These and other features of the present invention will become readily apparent upon further review of the following specification and drawings.

BRIEF DESCRIPTION OF THE DRAWINGS

FIG. 5A is a schematic diagram showing a CMOS realization of a DCCA (digitally controlled current amplifier) used in a digitally programmable high-order filter according to the present invention.

FIG. 5B is a symbol used herein to represent the circuit of FIG. 5A.

FIG. 6 is a schematic diagram of a CMOS realization of class-AB voltage buffer (VB) used in a digitally programmable high-order filter according to the present invention.

Similar reference characters denote corresponding features consistently throughout the attached drawings.

DETAILED DESCRIPTION OF THE PREFERRED EMBODIMENTS

The digitally programmable high-order filter uses simple active elements, namely, digitally controlled current amplifiers (DCCAs) and unity gain voltage buffers (VBs) with the help of R-2R ladders to realize several $n^{th}$-order filters. 'n+3' DCCAs and 'n' VBs may be used, and can provide programmability to either the filter's numerator coefficients or to the denominator coefficients. The digitally programmable high-order filter may include R-2R ladders in its negative feedback loops, resulting in a filter in which all coefficients are programmable. R-2R ladders and current division networks (CDNs) are incorporated in the circuitry for adjusting various transfer functions to affect tuning of the filters.

The general transfer function of an $n^{th}$-order filter is given by:

$$T(s) = \frac{N(s)}{D(s)} = \frac{a_n s^n + a_{n-1} s^{n-1} + \ldots + a_1 s + a_0}{s^n + b_{n-1} s^{n-1} + \ldots + b_1 s + b_0} \quad (1)$$

where $a_0$ through $a_n$ are real numbers, and $b_0$ through $b_{n-1}$ are positive real numbers. It is typically realized by designing a filter providing basic responses, namely, $a_i s_i / D(s)$ for i=0 to n, simultaneously. Other functions are obtained by properly adding or subtracting these basic responses, and hence it serves wide range of applications. However, to be compatible with IC applications, the filter has to satisfy the following two conditions. First, it must be reconfigurable without changing the hardware to promote the realization of different filter types. Second, it must exhibit programmable parameters to adjust the filter frequency responses.

Two-integrator-loop filter family is a vital topology for realizing multi-functions simultaneously. They inherently have the advantage of providing filter responses with independent tunable characteristics. They are realized either with a Tow-Thomas (TT) structure providing low pass and bandpass functions, or with a Kerwin-Huelsman-Newcomb (KHN) topology offering high pass response in addition to low pass and bandpass responses. Filter designs based on current-mode building blocks (CMBBs) have the potential to provide higher bandwidth and better linearity than their counterparts based on op-amps and gm (OTAs), respectively. A current follower (CF) has inherent advantages of wide bandwidth, large signal swings, and low power consumption. Similarly a current division network (CDN) can be utilized in the design of the CF to form a digitally controlled current follower (DCCF), which gives the advantage of programmability.

Figure 1:
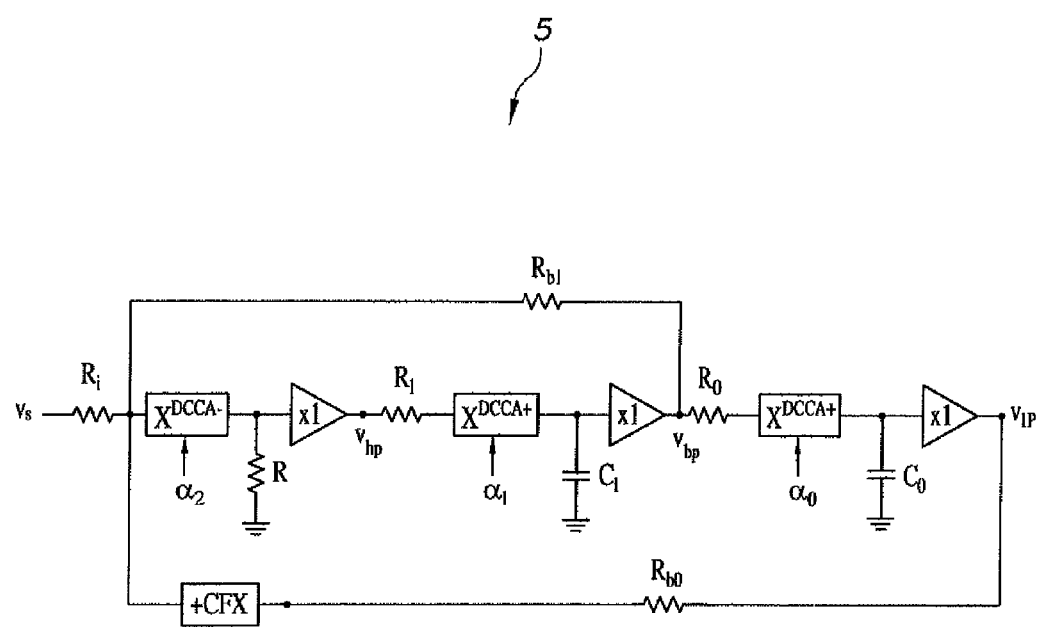
FIG. 1 is a schematic diagram showing a second order KHN (Kerwin-Huelsman-Newcomb) universal filter topology used in a digitally programmable high-order filter according to the present invention.
Figure 2:
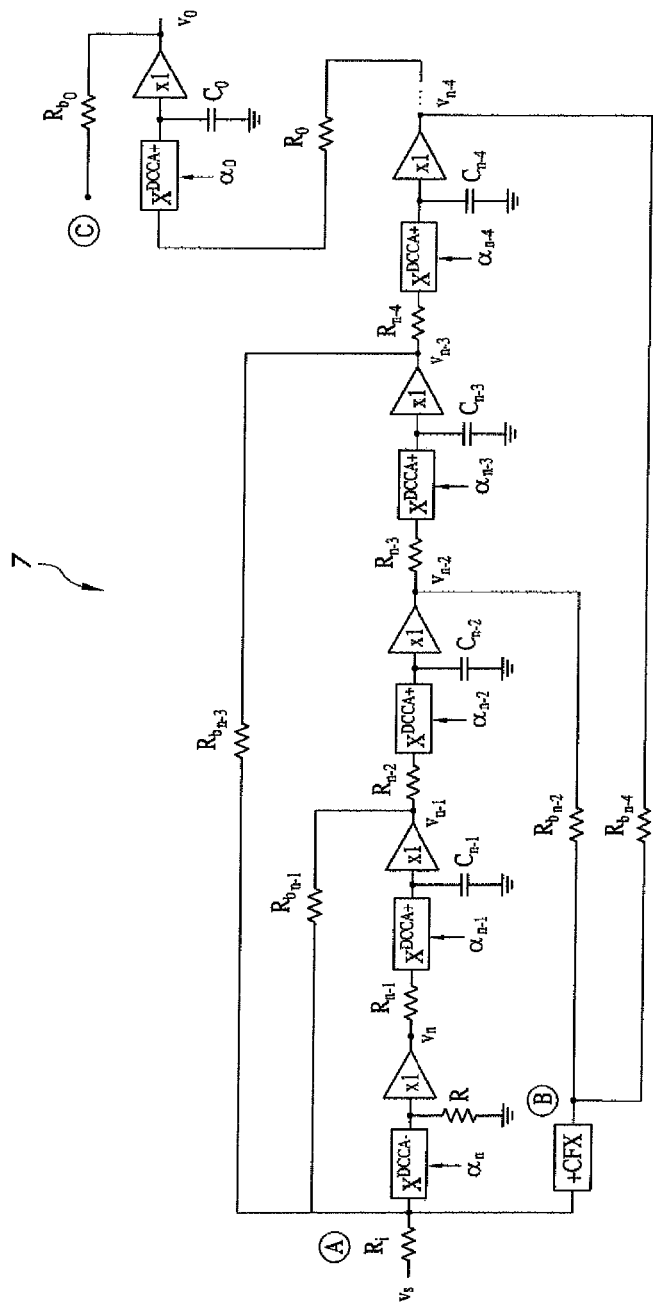
FIG. 2 is a schematic diagram showing a basic $n^{th}$-order filter topology used in a digitally programmable high-order filter according to the present invention.

As shown in FIG. 1, the digitally programmable high-order filter builds on a second-order universal filter circuit 5 using KHN topology. In the drawings, the triangles labeled x1 represent unity gain voltage buffers. In FIG. 1, the portion of the circuit between $v_s$ and $v_{hp}$ represents the voltage summer portion of a KHN filter, with $v_{hp}$ being the high pass voltage output. The portions of the circuit between $v_{hp}$ and $v_{bp}$, and between $v_{bp}$ and $v_{lp}$, together with the corresponding feedback loops including $R_{b1}$ and $R_{b0}$, respectively, represent integrator loops of the KHN filter, $v_{bp}$ providing a bandpass voltage output and $v_{lp}$ providing a low pass voltage output, respectively. The resultant circuit 7 provides a basic $n^{th}$-order filter topology, as shown in FIG. 2. Basic building blocks used as components in the $n^{th}$-order filter topology circuit 7 include R-2R ladders 9, shown in FIG. 3A, and current division networks 11, shown in FIG. 4A, for adjustment of tuning properties. The integrators are realized utilizing digitally controlled current amplifiers (DCCAs) and voltage buffers (VB).

Figure 3A:
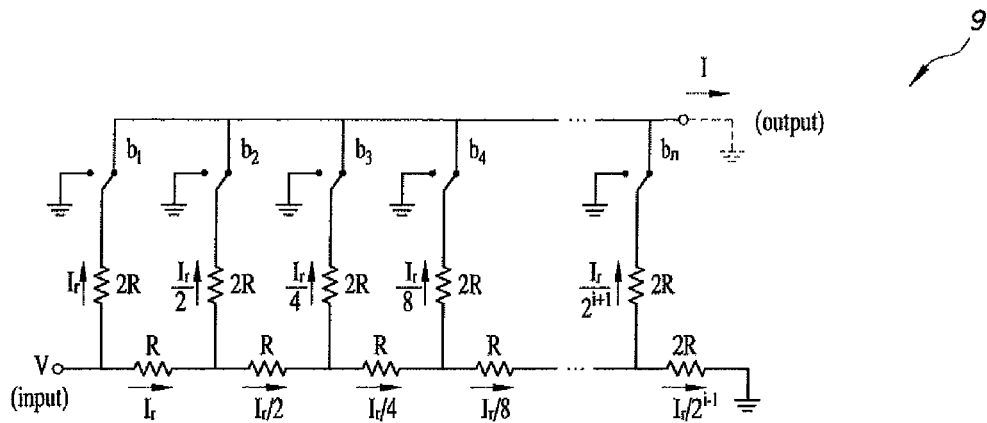
FIG. 3A is a schematic diagram showing a digitally controlled R-2R ladder used in a digitally programmable high-order filter according to the present invention.
Figure 3B:
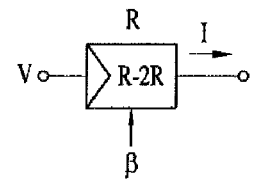
FIG. 3B is a symbol used herein to represent the circuit of FIG. 3A.

The R-2R ladder circuit, shown in FIG. 3A, can be considered as a digitally programmable resistor. It can be shown that the output current (I) is given by:

$$I = \sum_{i=1}^{n} \frac{b_i I_r}{2^{i-1}} \text{ where } I_r = \frac{V}{2R} \tag{2}$$

Therefore, the equivalent resistance, seen between the input and output nodes, is given by $$R_{eq} = \frac{V}{I} = \beta R \text{ where } \beta = \frac{1}{\sum_{i=1}^{n} b_i 2^{-i}} \tag{3}$$

where $b_i$ (equal to 0 or 1) is the $i^{th}$ bit in an n-bit digital control word.

The R-2R ladder can be incorporated as a circuit element into the design to provide precise frequency characteristics that can be tuned over a wide range. This can be applied as long as these resistors are connected to virtual ground, which simulates the proper operating condition of the R-2R ladder. This feature is inherently available at the input port X of the CF (current follower).

Figure 4A:
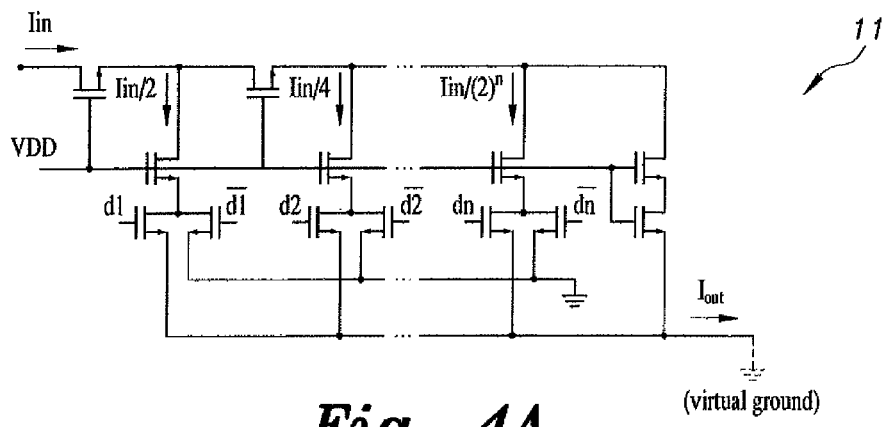
FIG. 4A is a schematic diagram showing a CMOS realization of a CDN (current division network) for adjusting various transfer functions used in a digitally programmable high-order filter according to the present invention.
Figure 4B:
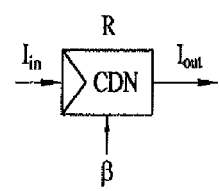
FIG. 4B is a symbol used herein to represent the circuit of FIG. 4A.

The current division network (CDN) II shown in FIG. 4A has a simple structure. It is inherently linear (i.e., insensitive to second-order effects and valid in all MOS operating regions). The input current is binary-weighted through the different branches. The output current can be expressed as:

$$I_o = \sum_{i=1}^{n} \frac{d_i I_{in}}{2^i} \tag{4}$$

where $d_i$ is the $i^{th}$ digital bit and n is the size of control word. The CDN 11 is suitable for low power operation, since it does not dissipate standby current. The proper operation of the CDN 11 requires the input node to be current driven and the output node to be virtually grounded.

A current division network, such as CDN 11, can be utilized in the design of a current follower (CF) to form a digitally controlled current amplifier (DCCA) 13, as shown in FIG. 5A. In the DCCA 13, the CDN 11 is driven by the drain current of M5 and M6, while its outputs $I_o$ are connected to the virtual ground node X. The X-terminal current is provided by the action of the class-AB negative feedback loop formed by transistors M3, M4, M5, and M6. Therefore, the transfer current characteristic of the DCCA 13 becomes:

$$I_z = \alpha I_X \text{ with } \alpha = 1/\Sigma_{i=1}^n d_i 2^{-i} \tag{5}$$

The most basic voltage buffer (VB) is the source follower circuit. However, since the transconductance of the MOS transistor is small, a negative feedback has to be applied to provide the required low output impedance. Also, additional circuitry is required to cancel the large DC offset between the input and the output. To avoid distortion caused by the body effect, a differential pair should be employed at the input port of the VB. CMOS realization of a low power VB with class-AB output stage is shown by the voltage buffer 15 in FIG. 6.

The general transfer functions of the basic filter of FIG. 2 can be expressed as:

$$\frac{v_n(s)}{v_s(s)} = \frac{\alpha_n R / R_i s^n}{D(s)} \text{ where} \tag{6a}$$

$$D(s) = s^n + \alpha_n R \frac{\alpha_{n-1}}{C_{n-1} R_{n-1} R_{bn-1}} s^{n-1} +$$

$$\frac{\alpha_{n-1} \alpha_{n-2}}{C_{n-1} C_{n-2} R_{n-1} R_{n-2} R_{bn-2}} s^{n-2} + \ldots +$$

$$\frac{\alpha_{n-1} \alpha_{n-2} \ldots \alpha_1}{C_{n-1} \ldots C_1 R_{n-1} \ldots R_1 R_{b1}} s + \frac{\alpha_{n-1} \alpha_{n-2} \ldots \alpha_1 \alpha_0}{C_{n-1} \ldots C_0 R_{n-1} \ldots R_0 R_{b0}}$$

$$\frac{v_{n-1}(s)}{v_s(s)} = \frac{\frac{\alpha_n R}{R_i} \frac{\alpha_{n-1} s^{n-1}}{C_{n-1} R_{n-1}}}{D(s)} \tag{6b}$$

$$\frac{v_1(s)}{v_s(s)} = \frac{\frac{\alpha_n R}{R_i} \frac{\alpha_{n-1} \alpha_{n-2} \ldots \alpha_1 s}{C_{n-1} R_{n-1} C_{n-2} R_{n-2} \ldots C_1 R_1}}{D(s)} \tag{6c}$$

$$\frac{v_0}{v_s} = \frac{\frac{\alpha_n R}{R_i} \frac{\alpha_{n-1} \alpha_{n-2} \ldots \alpha_1 \alpha_0}{C_{n-1} R_{n-1} C_{n-2} R_{n-2} \ldots C_1 R_1 C_0 R_0}}{D(s)} \tag{6d}$$

In general, $$\frac{v_m(s)}{v_s(s)} = (-1)^m \frac{\alpha_n R}{R_i} \frac{s^m \prod_{j=m}^{n-1} \frac{\alpha_j}{C_i R_i}}{s^n + \alpha_n R \left( \sum_{i=0}^{n-1} \frac{s^i}{R_{bi}} \prod_{j=i}^{n-1} \frac{a_j}{C_j R_j} \right)} \text{ for} \tag{6e}$$

$m = 0$ to $n - 1$

The output signals can be properly added to realize the general transfer function of (1). It can be seen from equations (6a)-(6e) that either the coefficients of the numerator or of the denominator can be adjusted by choosing $\alpha_n, \alpha_{n-1}, \ldots \alpha_1, \alpha_0$ in the given order. However, it would not be possible to arbitrarily set all of the coefficients. Fortunately, there are several ways to enhance the programmability feature, starting from the basic design of FIG. 2. These options can be classified in the following four categories, which include Option 1: DCCA plus R-2R ladders in the forward path; Option 2: DCCA in the forward path and DCCA (Option 2(i)) or R-2R ladders (Option 2(ii)) in feedbacks; Option 3: two elements (DCCAs and/or R-2Rs) in one path and a single element (DCCA or R-2R) in the other path; or Option 4: Both DCCA and R-2R ladders in both the forward and feedback paths.

Figure 7:
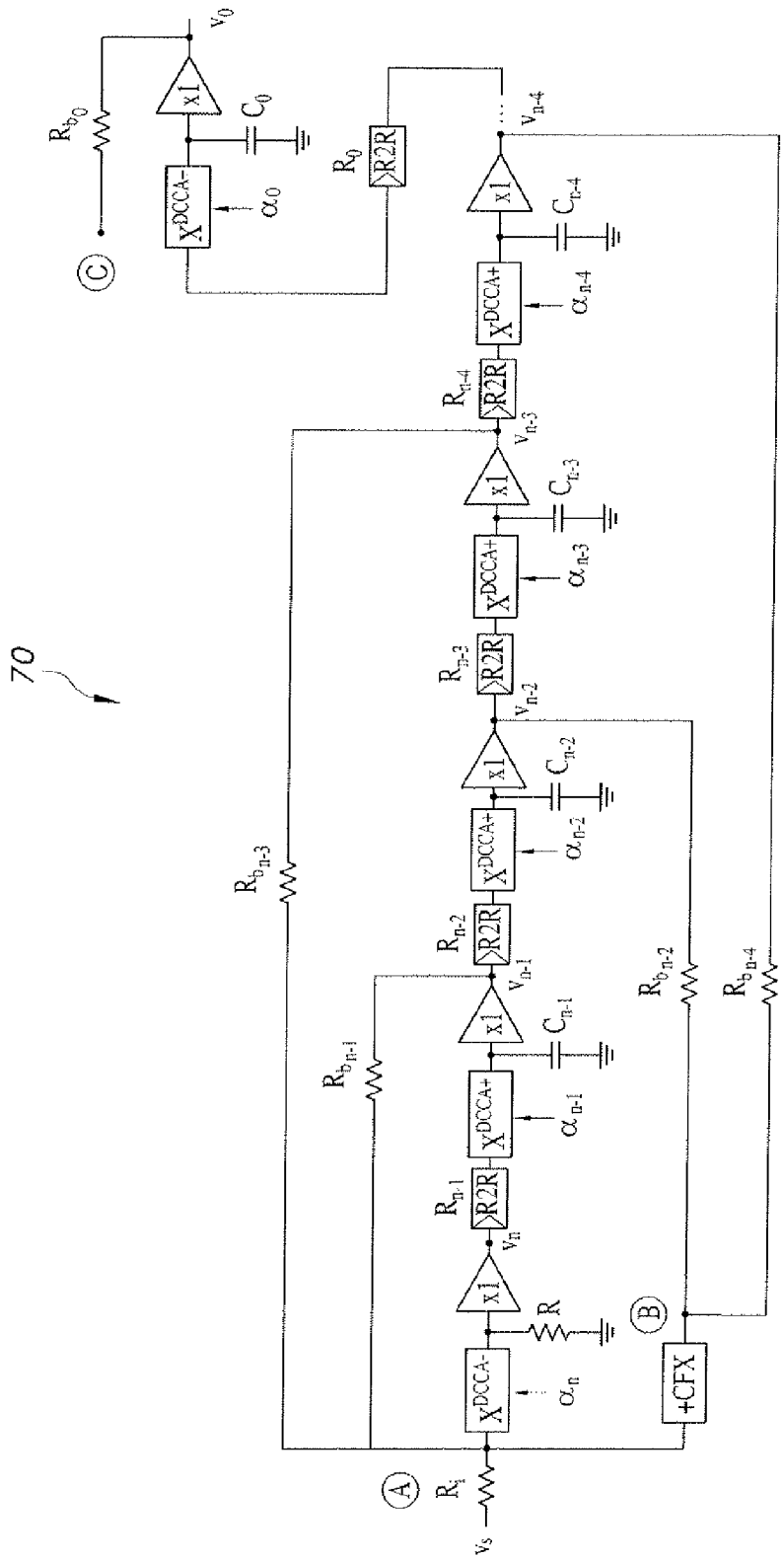
FIG. 7 is a schematic diagram of a digitally programmable high-order filter according to the present invention, showing a first modified design adopting R-2R ladder in the forward path.

The tuning range of the filter of FIG. 2 is decided by the number of bits of the current division network (CDN) 11. It can be improved by increasing the number of bits of the CDN 11. Alternatively, Option 1 suggests replacing the forward resistors by R-2R ladders 9, as shown in FIG. 7. It is observed that the filter 70 of FIG. 7 would require fewer total passive resistances, compared with FIG. 2, for a given frequency. For example, for a fourth-order filter, designing for a pole frequency of 10 kHz and using equal C's and R's, the filter of FIG. 6 would need a minimum RC time constant of 6.0900 μs. If capacitors of 30 pF were used, the resistance values required would be 203 kΩ. On the other hand, in the filter 70 of FIG. 7, the minimum RC time constant would be 95.16 ns, which could be realized with C's of 30 pF and R's of 3.17 kΩ. For a 6-bit R-2R ladder, this corresponds to 72% saving of the total feedback resistance. Note that terminal C of FIG. 7 will be feedback to terminal A if the filter order is even, or terminal B if the order is odd. The transfer functions of the modified filter 70 of FIG. 7 can be written as:

$$\frac{v_n(s)}{v_s(s)} = \frac{\alpha_n R/R_i s^n}{s^n + \alpha_n R\left[\begin{array}{c}\frac{\alpha_{n-1}}{C_{n-1}R_{n-1}R_{bn-1}\beta_{n-1}}s^{n-1} + \\ \frac{\alpha_{n-1}\alpha_{n-2}}{C_{n-1}C_{n-2}R_{n-1}R_{n-2}R_{bn-2}\beta_{n-2}}s^{n-2} + \ldots + \\ \frac{\alpha_{n-1}\alpha_{n-2}\ldots\alpha_1}{C_{n-1}\ldots C_0 R_{n-1}\ldots R_1 R_{b1}\beta_{n-1}\beta_{n-2}\beta_1}s + \\ \frac{\alpha_{n-1}\alpha_{n-2}\ldots\alpha_1\alpha_0}{C_{n-1}\ldots C_0 R_{n-1}\ldots R_0 R_{b0}\beta_{n-1}\beta_{n-2}\beta_0}\end{array}\right]} \quad (7a)$$

$$\frac{v_m(s)}{v_s(s)} = (-1)^m \frac{\alpha_n R}{R_{in}} \frac{s^m \prod_{j=m}^{n-1}\frac{\alpha_j}{C_i R_i \beta_j}}{s^n + \alpha_n R\left(\sum_{i=0}^{n-1}\frac{s^i}{R_{bi}}\prod_{j=i}^{n-1}\frac{a_j}{C_j R_j \beta_j}\right)} \quad \text{for} \quad (7b)$$

$m = 0$ to $n-1$

Figure 8:
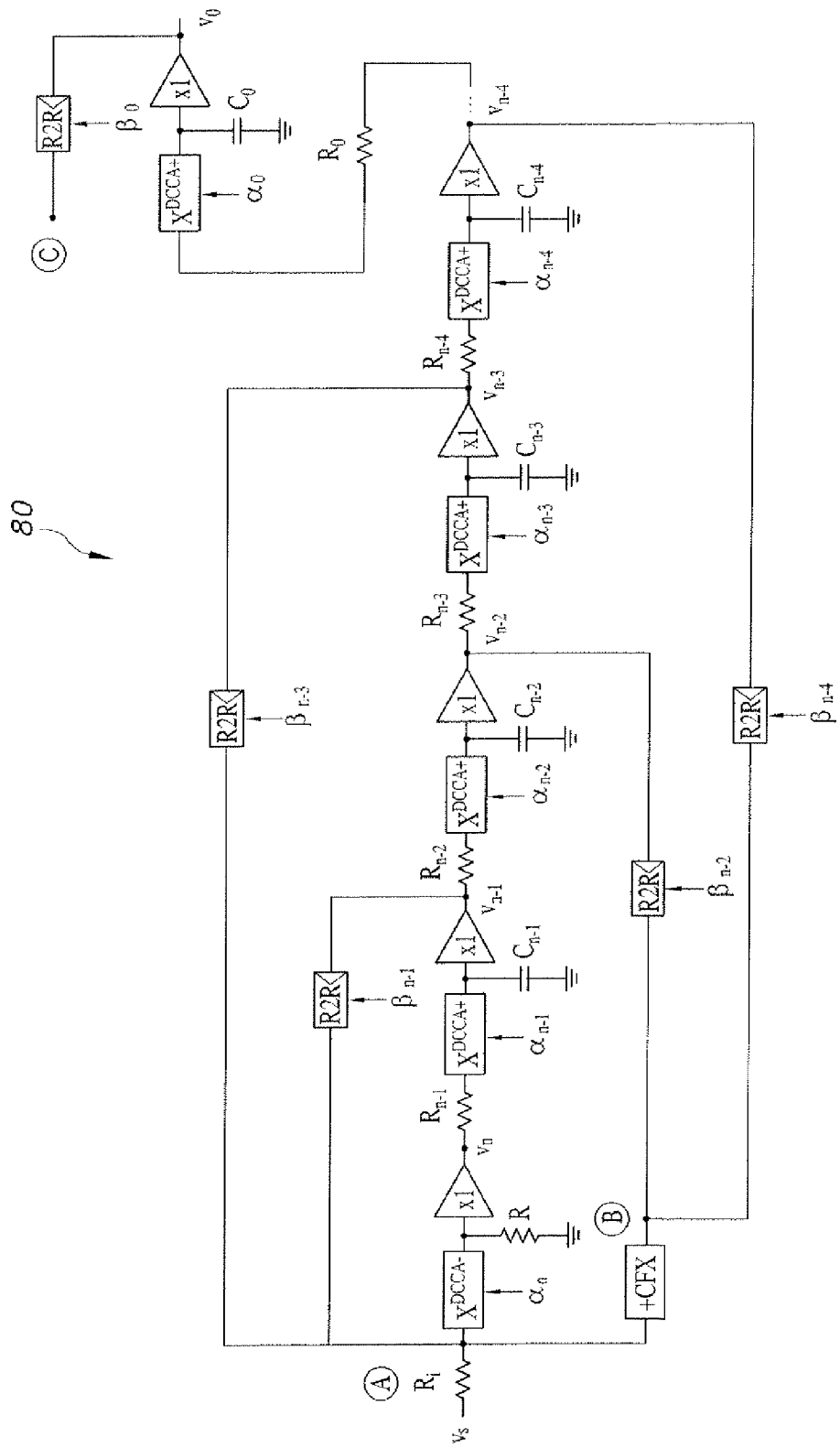
FIG. 8 is a schematic diagram of a digitally programmable high-order filter according to the present invention, showing a 2nd proposed design that uses R-2R ladders in feedback loops.

The main drawback of the filters of FIG. 2 and FIG. 7 is that the coefficients of their D(s) cannot be arbitrarily chosen. For example, the coefficients of N(s) can be adjusted by selecting $\alpha_0$ to $\alpha_n$ for FIG. 2 and $\alpha_0$ to $\alpha_n$ and/or $\beta_0$ to $\beta_{n-1}$ for FIG. 7, but the coefficients of the D(s) still cannot be arbitrarily chosen. These topologies can be found suitable for realizing some of the basic functions but not all. In order to add programmability feature to the coefficients of D(s), the feedback paths, which use passive resistors, can be replaced by a DCCA (Option 2(i)) or an R-2R ladder (Option 2(ii)). Adding extra new DCCAs would increase the power consumption. The ladders consume no DC power, and hence this option is more attractive for low power applications. The resulting filter 80 is shown in FIG. 8 and its transfer functions can be written as:

$$\frac{v_n(s)}{v_s(s)} = \frac{\alpha_n R/R_i s^n}{s^n + \alpha_n R\left[\begin{array}{c}\frac{\alpha_{n-1}}{C_{n-1}R_{n-1}\beta_{n-1}R_{bn-1}}s^{n-1} + \\ \frac{\alpha_{n-1}\alpha_{n-2}\alpha_{bn-2}}{C_{n-1}C_{n-2}R_{n-1}R_{n-2}\beta_{n-2}R_{bn-2}}s^{n-2} + \ldots + \\ \frac{\alpha_{n-1}\alpha_{n-2}\ldots\alpha_1\alpha_1}{C_{n-1}\ldots C_1 R_{n-1}\ldots R_1 \beta_1 R_{b1}}s + \\ \frac{\alpha_{n-1}\alpha_{n-2}\ldots\alpha_1\alpha_0\alpha_0}{C_{n-1}\ldots C_1 R_{n-1}\ldots R_0 \beta_0 R_{b0}}\end{array}\right]} \quad (8a)$$

$$\frac{v_m(s)}{v_s(s)} = (-1)^m \frac{\alpha_n R}{R_i} \frac{s^m \prod_{j=m}^{n-1}\frac{\alpha_j}{C_i R_i}}{s^n + \alpha_n R\left(\sum_{i=0}^{n-1}\frac{s^i}{\beta_i R_{bi}}\prod_{j=i}^{n-1}\frac{a_j}{C_j R_j}\right)} \quad \text{for} \quad (8b)$$

$m = 0$ to $n-1$

Therefore, it can be seen that the coefficients of numerator can be adjusted by choosing $\alpha_n, \alpha_{n-1}, \ldots \alpha_1, \alpha_0$ in the given order. Then, the coefficients of the denominator polynomial can be adjusted independently by selecting $\beta_0$ through $\beta_{n-1}$.

The third class exhibiting enhanced tuning features consists of the following alternatives: Option 3 (i), using R-2R ladders and DCCAs in the forward path, and using DCCAs in the feedback path; Option 3 (ii), using DCCAs in the forward path, and using R-2R ladders and DCCAs in the feedback path; and Option 3 (iii), using R-2R ladders and DCCAs in the forward path, and using R-2R ladders in the feedback path. The fourth category exhibits the largest tuning range, but with maximum power and area. Table I summarizes the different possible tuning features and their ranges for various topologies.

TABLE I

Comparison of various options of high-order filter

| | Options | | | | | | |
|---|---|---|---|---|---|---|---|
| | (1) | (2) | | (3) | | | (4) |
| Criteria | | (i) | (ii) | (i) | (ii) | (iii) | |
| Tuning features | N(s) [or D(s)] | N(s) and D(s) | N(s) and D(s) | N(s) and D(s) | N(s) and D(s) | N(s) and D(s) | N(s) and D(s) |
| Tuning range | $[2^{2N}$ | $2^N$ | $2^N$ | $2^{2N}$ | $2^N$ | $2^{2N}$ | $2^{2N}$ |
| Relative Power | Same | Double | Same | Double | Double | Same | Double |
| Relative Area | Double* | Double* | Double* | Triple* | Triple* | Triple | Quadruple* |

Therefore, apart from Option 1 all other topologies exhibit electronically programmable coefficients. For applications where power is the most important factor, designs (2)(ii) and (3)(iii) are the most attractive. If area is also important, then Option 2(ii) (i.e., the filter of FIG. 8) is preferred.

The non-ideal AC response of the filter can be found by considering the non-ideal effects of the DCCA and CF characterized by input parasitic impedance ($Z_x$) and output parasitic conductance ($Y_z$). Since the DCCA is designed to exhibit low input impedance and high output impedance, $Z_x$ and $Y_z$ are dominated by series resistance ($r_x$) and parallel capacitance ($C_z$), respectively. Similarly, the non-ideal terminal characteristics of the VB can be modeled by shunt capacitance $C_b$ and series resistance $r_b$ at the input and output ports, respectively.

For the topologies of FIG. 2 and FIG. 8, the effect of $C_z$ for $DCCA_0$ through $DCCA_{n-1}$ can be easily observed, as they are in parallel with the passive capacitances. Thus, their values can be absorbed as $C'_i=C_i+Cz_i$ (for i=0 to n−1). Also, $r_x$ for $DCCA_0$ through $DCCA_{n-1}$ are in series with forward path passive resistors. Thus, their values can be absorbed as $R'_i=R_i+r_{xi}$ (for i=0 to n−1). Therefore, the effects of the parasitic will manifest themselves at nodes A due to $r_{xn}$, and output capacitance of the feedback CF ($C_A$); and output node of $DCCA_n$ due to the output capacitance of $DCCA_n$ and $VB_n$. The effect of $r_x$ of the feedback CF can be neglected, given that it is much smaller than the passive resistors connected at node B. On the other hand, the effect of $C_{bi}$ for 0 to n−1 VBs can be easily absorbed, as they are in parallel with the passive capacitances. Thus, their values can be absorbed as $C'_i=C_i+Cz_i+Cb_i$ (for i=0 to n−1). Also, the effect of $r_{bi}$ can be neglected, as the VB are loaded with much larger resistive loads.

For example, it can be shown that non-ideal analysis of the $4^{th}$-order filter obtained from FIG. 8 will yield the following relations:

$$\frac{v_4(s)}{v_s(s)} = \frac{\frac{\alpha_4 R}{R_i}s^4}{D(s)} \tag{9a}$$

$$\frac{v_3(s)}{v_s(s)} = -\frac{\frac{\alpha_4 R}{R_i}\frac{\alpha_3}{C_3 R_3}s^3}{D(s)} \tag{9b}$$

$$\frac{v_2(s)}{v_s(s)} = -\frac{\frac{\alpha_4 R}{R_i}\frac{\alpha_3 \alpha_2}{C_3 C_2 R_3 R_2}s^2}{D(s)} \tag{9c}$$

$$\frac{v_1(s)}{v_s(s)} = -\frac{\frac{\alpha_4 R}{R_i}\frac{\alpha_3 \alpha_2 \alpha_1}{C_3 C_2 C_1 R_3 R_2 R_1}s}{D(s)} \tag{9d}$$

$$\frac{v_0(s)}{v_s(s)} = -\frac{\frac{\alpha_4 R}{R_i}\frac{\alpha_3 \alpha_2 \alpha_1 \alpha_0}{C_3 C_2 C_1 C_0 R_3 R_2 R_1 C_0}}{D(s)} \text{ where} \tag{9e}$$

$$D(s) = \tag{9f}$$
$$s^6 C_A C_{Z4} R r_{x4} + s^5 \left[ C_A r_{x4} + C_{Z4} R \left( 1 + \frac{r_{x4}}{R_i} + \frac{r_{x4}}{\beta_1 R_{b1}} + \frac{r_{x4}}{\beta_3 R_{b3}} \right) \right] +$$
$$s^4 \left( 1 + \frac{r_{x4}}{R_i} + \frac{r_{x4}}{\beta_1 R_{b1}} + \frac{r_{x3}}{\beta_3 R_{b3}} \right) +$$
$$\alpha_4 R \left( \frac{\frac{\alpha_3}{C_3 R_3 \beta_3 R_{b3}}s^3 + \frac{\alpha_{CF}\alpha_3\alpha_2}{C_3 C_2 R_3 R_2 \beta_2 R_{b2}}s^2 +}{\frac{\alpha_3\alpha_2\alpha_1}{C_3 C_2 C_1 R_3 R_2 R_1 \beta_1 R_{b1}}s + \frac{\alpha_{CF}\alpha_3\alpha_2\alpha_1\alpha_0}{C_3 C_2 C_1 C_0 R_3 R_2 R_1 R_0 \beta_0 R_{b0}}} \right)$$

It can be seen that $r_{x4}$ and R result in introducing $s^6$ and $s^5$ terms in D(s) and error in its $s^4$ coefficient. The error $s^4$ can be safely neglected as long as $r_{x4}$ is kept small. But the $s^6$ and $s^5$ terms will cause deviations in the high frequency response compared with the ideal response. It can be shown for frequencies 'ω' much smaller than $1/(C_A r_{x4}+C_{z4}R)$ ($C_A$ is the total capacitance at node A), the effect of the $s^6$ term can be neglected. Similarly, the $s^5$ term can be neglected for frequencies 'ω' much smaller than $1/(C_A r_{x4}+C_{z4}R)$. Since R is typically larger than $r_{x4}$, and assuming $C_A$ and $C_{Z4}$ of similar size, the non-ideal terms can be neglected as long as the operating frequency is smaller than $1/(C_{Z4}R)$. For example, when $C_A$ and $C_{Z4}$ are 0.1 pF, $R_{x4}$ is 500Ω, and R is 1 kΩ, the effects of $s^6$ and $s^5$ terms can be neglected for frequencies up to approximately 2 GHz and 1 GHz, respectively.

Table II shows a summary of the main characteristics of the filter 80 of FIG. 8 versus the filter 70 of FIG. 7. The following performance characteristics are considered: (1) electronically tuned denominator coefficients, (2) electronically tuned numerator coefficients, (3) number of followers, (4) employing single output active elements, (5) proper output impedances, (6) number of resistors, (7) number of capacitors, and (8) rounded capacitors.

TABLE II

Comparison of the proposed high-order filter circuits

| Works | (1) | (2) | (3) | (4) | (5) | (6) | (7) | (8) |
|---|---|---|---|---|---|---|---|---|
| FIG. 7 | Yes | No | 2n + 3 | Yes | Yes | n + 2 and N R2R ladders | n | Yes |
| FIG. 8 | Yes | Yes | 2n + 3 | Yes | Yes | n + 2 and N R2R ladders | n | Yes |

The filter 80 has the advantage of providing programmability of numerator and denominator coefficients.

Figure 9:
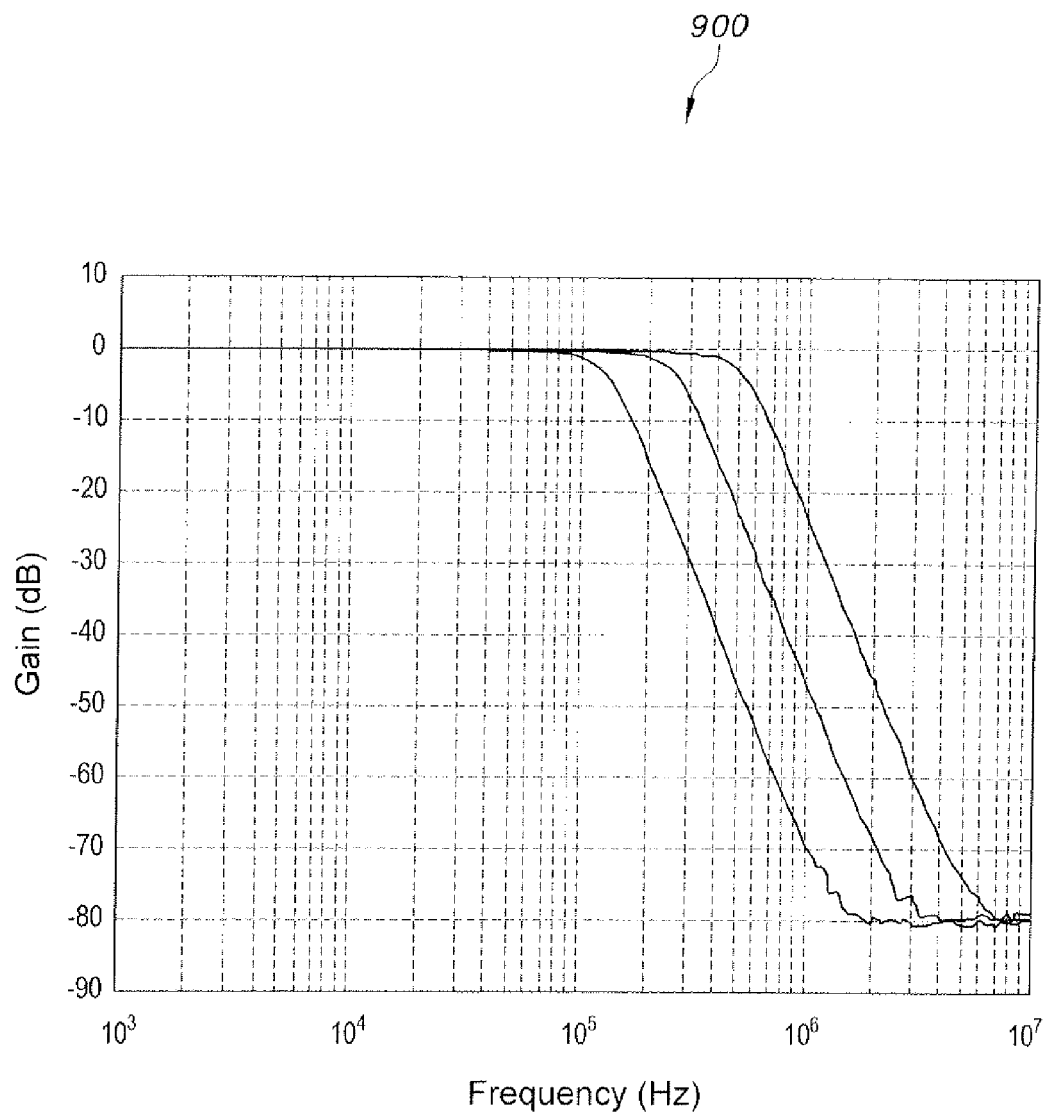
FIG. 9 is a plot showing measured low pass responses of an exemplary 4th-order filter patterned after FIG. 8 and designed to exhibit a low pass Butterworth response with a pole frequency of 500 kHz.

The DCCA using a 6-bit CDN and the VB has been fabricated in a 0.35 μm N-well CMOS process. A $4^{th}$-order filter obtained from filter 80 was implemented using equal resistors in the forward path ($R_0=R_1=R_2=R_3$) of 801 kΩ and equal capacitors ($C_0=C_1=C_2=C_3$) of 50 pF. R-2R ladders with 6-bits and base resistance of 2 kΩ were used in the feedback paths. Also, the passive resistance $R_i$ was replaced by an R-2R ladder with 6-bits and base resistance of 2 kΩ to allow tuning of the filter gain. The grounded resistor R is selected to be 8 kΩ in order to permit achieving high pass gain up to 12 dB. Throughout testing, the supply voltages were set to ±1.5V and the currents of the DCCA and VB were $I_B$=20 μA and $I_{SB}$=5 μA. With 6-bit CDN, the current gain (α) of the DCCA can be adjusted from 1.02 to 64. Similarly, using 6-bit R-2R ladders allows varying the equivalent resistance over the range 2kΩ to $2^6$×2kΩ. First, the filter was designed to realize a low pass Butterworth response with pole frequency of 500 kHz through programming the gains of the DCCAs such that $\alpha_4$-1.02, $\alpha_3$=8, $\alpha_2$=16, $\alpha_1$=9.14, $\alpha_0$=4.92. These values correspond to respective digital words of 111111, 001000, 000100, 000111, 001101. Meanwhile, the controlling word of all ladders was 111111 so that the equivalent resistance of each is 2 kΩ. The resulting low pass magnitude response having unity gain was measured. Then, $\alpha_3$, $\alpha_2$, $\alpha_1$, and $\alpha_0$ were programmed simultaneously (divided by two and then by four) to scale down the pole frequency from 500 kHz to 250 kHz and then to 125 kHz. The results of these measurements are shown in plot 900 of FIG. 9. This is achieved while preserving the Butterworth response and gain.

Figure 10:
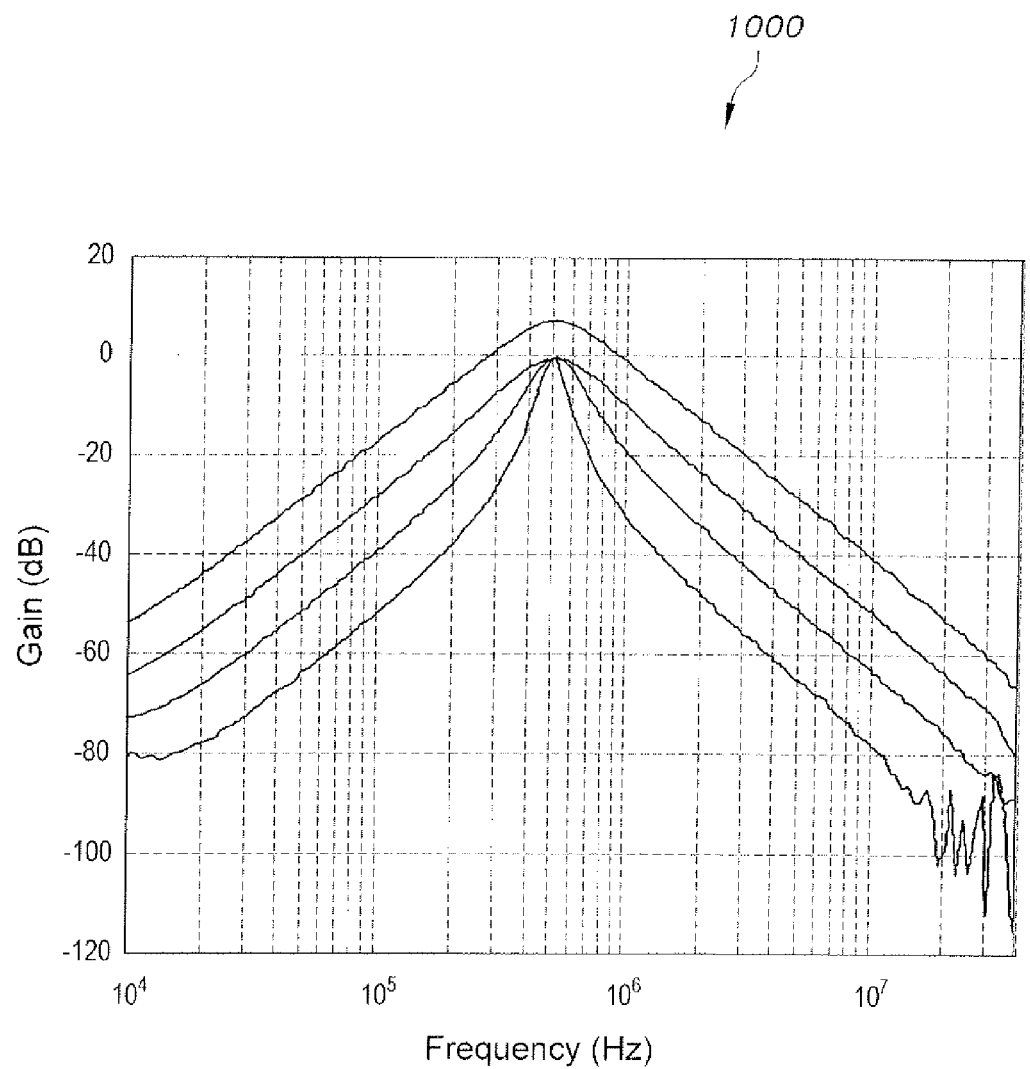
FIG. 10 is a plot showing measured low pass Butterworth responses of the bandpass filter of FIG. 9 demonstrating a $Q_0$ of 0.707, then with gain adjusted to unity, and then with a Q of 3 and a Q of 5, respectively, while holding the center frequency and gain constant.

The importance of having R-2R ladders to enhance the programmability feature will be demonstrated by considering the bandpass filter design in the following example. It will be shown how the ladders can be utilized to increase the quality factor of the filter without changing the center frequency and gain. The starting response of the bandpass filter is that associated with low pass Butterworth response having $Q_o$ of 0.707, shown in plot 1000 of FIG. 10. The corresponding normalized coefficients of equation (1) are given in the first row of Table III. The associated ideal center frequency gain is 7.68 dB. To set the gain to unity, the equivalent resistance of the $R_i$ ladder has to be increased by a factor of 2.44 (i.e., $\beta_i$=2.44, programming digital word to 011010). The theoretical values required to increase the quality factor to 3 and 5 without changing the center frequency and gain are given in the third and fourth rows, respectively. The closest corresponding values for β's of the various ladders are also given. Plot 1000 of FIG. 10 illustrates the measured bandpass magnitude responses.

TABLE III

Varying $Q_o$ of the bandpass filter

| Parameters | Coefficients | | | | | Tuning Parameters | | | | |
|---|---|---|---|---|---|---|---|---|---|---|
| | $a_2$ | $b_3$ | $b_2$ | $b_1$ | $b_0$ | $\beta_i$ | $B_3$ | $\beta_2$ | $\beta_1$ | $\beta_0$ |
| Starting coefficients | 3.41 | 2.61 | 3.41 | 2.61 | 1 | 1.02 | 1.02 | 1.02 | 1.02 | 1.02 |
| Gain of unity | 1.4 | 2.61 | 3.41 | 2.61 | 1 | 2.44 | 1.02 | 1.02 | 1.02 | 1.02 |
| Increase Q to 3 | 0.27 | 1.04 | 2.27 | 1.04 | 1 | 12.8 | 2.56 | 1.52 | 2.56 | 1.02 |
| Increase Q to 5 | 0.096 | 0.62 | 2.1 | 0.625 | 1 | 36 | 4.27 | 1.63 | 4.27 | 1 |

Figure 11:
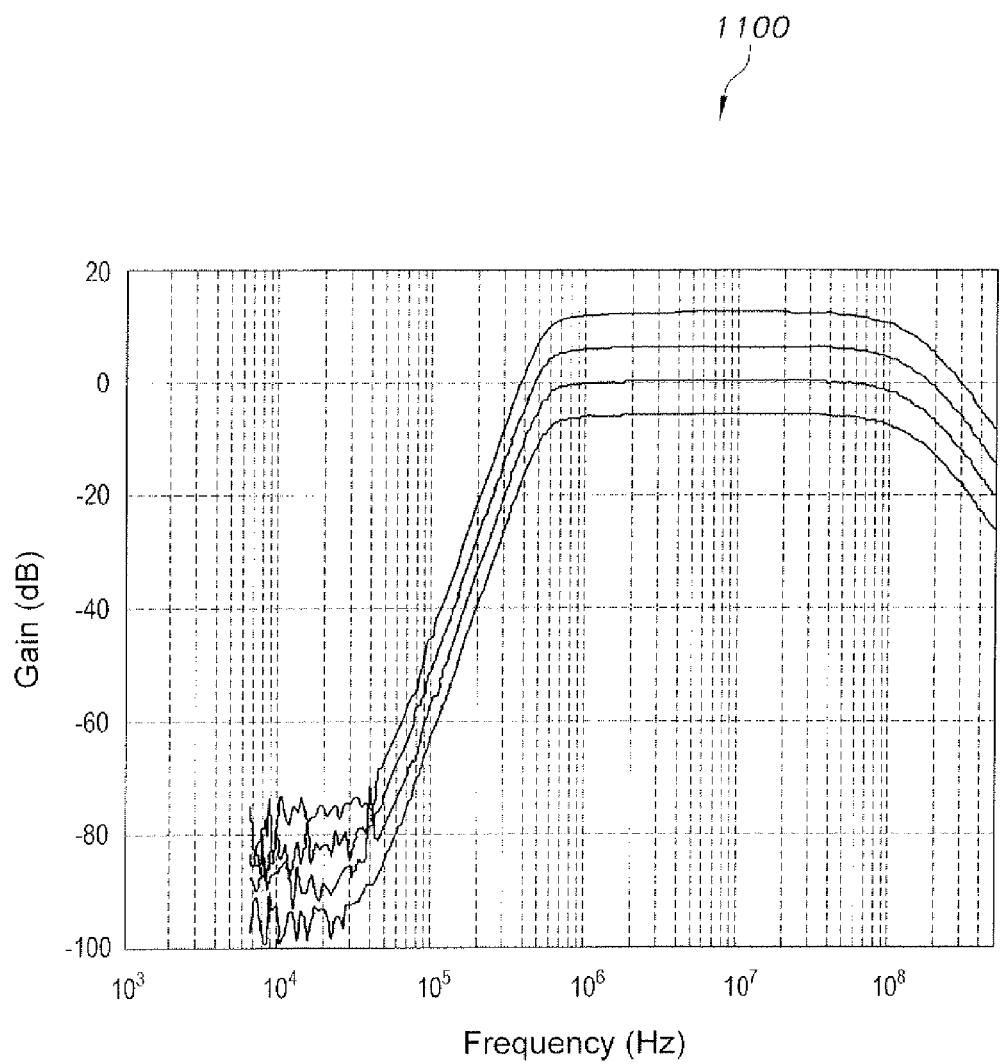
FIG. 11 is a plot showing measured high pass magnitude responses of the bandpass filter of FIG. 9 demonstrating gain tuning of −6, 0, 6, and 12 dB through programming of the R-2R ladders.

In addition, several high pass magnitude responses demonstrating gain tuning of −6, 0, 6 and 12 dB through proper programming of R-2R ladder of $R_i$ are shown in plot 1100 of FIG. 11. It is found that the flat bandwidths of the high pass responses extend to frequencies up to approximately 100 MHz.

It is to be understood that the present invention is not limited to the embodiments described above, but encompasses any and all embodiments within the scope of the following claims.

I claim:

1. A digitally programmable high-order filter, comprising a filter circuit defining a forward path for filtering a signal, the forward path having a voltage summer portion followed by at least two voltage integrator loop portions in order to provide at least a high pass filter output, a bandpass filter output, and a low pass filter output, the voltage summer and voltage integrator loop portions each having a digitally controlled current amplifier and a unity gain voltage buffer, the voltage integrator loop portions each having a feedback path, the digitally controlled current amplifier including a current follower circuit having a current division network incorporated therein, the filter circuit including at least one R-2R ladder circuit incorporated therein, whereby the filter circuit has transfer functions digitally programmable by programming the digitally controlled current amplifiers and the at least one R-2R ladder circuit.

2. The digitally programmable high-order filter according to claim 1, wherein the forward path includes both said digitally controlled current amplifiers and said at least one R-2R ladder circuit.

3. The digitally programmable high-order filter according to claim 1, wherein the feedback paths include only passive resistors.

4. The digitally programmable high-order filter according to claim 1, wherein the forward path includes said digitally controlled current amplifiers and passive resistors in the forward path, said at least one R-2R ladder circuit being disposed only in the feedback paths.

5. The digitally programmable high-order filter according to claim 1, wherein the forward path includes said digitally controlled current amplifiers in both the forward and feedback paths, said at least one R-2R ladder circuit being disposed only in the forward path.

6. The digitally programmable high-order filter according to claim 1, wherein the forward path includes said digitally controlled current amplifiers in the forward path and the feedback paths, said at least one R-2R ladder circuit being disposed only in the feedback paths.

7. The digitally programmable high-order filter according to claim 1, wherein the forward path includes said digitally controlled current amplifiers only in the forward path, said at least one R-2R ladder comprising a plurality of R-2R ladder circuits disposed in both the forward path and the feedback paths.

8. The digitally programmable high-order filter according to claim 1, wherein said current division network has six binary digits of control resolution.

9. The digitally programmable high-order filter according to claim 1, wherein said at least one R-2R ladder circuit has six binary digits of control resolution.

10. A digitally programmable high-order filter, comprising:
a filter having integrators configured in multi-integrator loop Kerwin-Huelsman-Newcomb (KHN) circuitry;
a plurality of current division networks (CDNs), each of said CDNs having a virtual ground connection, said CDNs binary weighing an input current via different circuit branches of said CDNs;
a plurality of current followers (CFs) having circuitry combined with said CDNs;
a plurality of digitally controlled current amplifiers (DCCAs), formed by said CF CDN circuitry combination, each of said DCCAs having a transfer function characterized by the relation, $$I_z = \alpha I_x \text{ with } \alpha = 1/\Sigma_{i-1}{}^n d_i 2^{-i};$$

a plurality of low power voltage buffers (VBs) combined with said multi-integrator circuitry wherein circuitry of said integrators is realized by said plurality of DCCAs and said plurality of low power voltage buffers (VBs);
each of the CDNs having a first filter control input responsive to a feed forward filter control signal, $\alpha$, the CDNs changing frequency characteristics exhibited by the filter unit responsive to the $\alpha$ control signal, thereby making the filter unit fully programmable; and
a digitally programmable nth-order filter output to be fed to a post stage.

11. The digitally programmable high-order filter according to claim 10, further comprising means for independently setting denominator coefficients of said digitally programmable nth-order filter to user selectable values.

12. The digitally programmable high-order filter according to claim 11, further comprising a plurality of R-2R ladders disposed in a feedback path of said multi-integrator loop KHN circuitry, said plurality of R-2R ladders providing a second filter control input responsive to a feedback filter control signal, $\beta$; and wherein said multi-integrator loop KHN circuitry has a transfer function characterized by the relations, $$\frac{v_n(s)}{v_s(s)} = \frac{\alpha_n R/R_i s^n}{s^n + \alpha_n R \left[ \dfrac{\alpha_{n-1}}{C_{n-1} R_{n-1} \beta_{n-1} R_{bn-1}} s^{n-1} + \dfrac{\alpha_{n-1} \alpha_{n-2} \alpha_{bn-2}}{C_{n-1} C_{n-2} R_{n-1} R_{n-2} \beta_{n-2} R_{bn-2}} s^{n-2} + \ldots + \dfrac{\alpha_{n-1} \alpha_{n-2} \ldots \alpha_1 \alpha_1}{C_{n-1} \ldots C_1 R_{n-1} \ldots R_1 \beta_1 R_{b1}} s + \dfrac{\alpha_{n-1} \alpha_{n-2} \ldots \alpha_1 \alpha_0 \alpha_0}{C_{n-1} \ldots C_0 R_{n-1} \ldots R_0 \beta_0 R_{b0}} \right]},$$

and

-continued $$\frac{v_m(s)}{v_s(s)} = (-1)^m \frac{\alpha_n R}{R_i} \frac{s^m \prod_{j=m}^{n-1} \frac{\alpha_j}{C_i R_i}}{s^n + \alpha_n R \left( \sum_{i=0}^{n-1} \frac{s^i}{\beta_i R_{bi}} \prod_{j=i}^{n-1} \frac{a_j}{C_j R_j} \right)} \text{ for}$$

$m = 0$ to $n - 1$.

13. The digitally programmable high-order filter according to claim 12, wherein each said DCCA further comprises CDNs having six binary digits of control resolution.

14. The digitally programmable high-order filter according to claim 13, wherein each said R-2R has six binary digits of control resolution.

15. The digitally programmable high-order filter according to claim 14, further comprising means for utilizing said plurality of R-2R ladders to set the different filter coefficients to user desirable characteristics.

16. The digitally programmable high-order filter according to claim 15, further comprising means for independently setting a lowpass pole frequency, a bandpass quality factor, and a highpass gain of said digitally programmable nth-order filter to user selectable characteristics.

* * * * *